(12) United States Patent
Yamauchi et al.

(10) Patent No.: US 6,642,577 B2
(45) Date of Patent: Nov. 4, 2003

(54) SEMICONDUCTOR DEVICE INCLUDING POWER MOSFET AND PERIPHERAL DEVICE AND METHOD FOR MANUFACTURING THE SAME

(75) Inventors: Shoichi Yamauchi, Obu (JP); Yasushi Urakami, Tokai (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/804,024

(22) Filed: Mar. 13, 2001

(65) Prior Publication Data

US 2001/0030347 A1 Oct. 18, 2001

(30) Foreign Application Priority Data

Mar. 16, 2000 (JP) ........................... 2000-079344
Mar. 16, 2000 (JP) ........................... 2000-079346

(51) Int. Cl.⁷ .................... H01L 29/76; H01L 29/94
(52) U.S. Cl. .................. 257/341; 257/343; 257/335; 257/288; 257/213
(58) Field of Search ............... 257/213, 288, 257/329, 341–343, 355, 335

(56) References Cited

U.S. PATENT DOCUMENTS

| 4,896,199 A | * | 1/1990 | Tsuzuki et al. ........... 357/28 |
| 5,233,215 A | * | 8/1993 | Baliga .................... 257/490 |
| 5,508,547 A | * | 4/1996 | Yang ...................... 257/343 |
| 5,828,101 A |   | 10/1998 | Endo |
| 5,831,338 A | * | 11/1998 | Kawamoto ............... 257/784 |
| 5,891,776 A | * | 4/1999 | Han et al. ................ 438/274 |
| 5,929,482 A | * | 7/1999 | Kawakami et al. ....... 257/328 |
| 6,191,447 B1 | * | 2/2001 | Baliga .................... 257/330 |
| 6,236,099 B1 | * | 5/2001 | Boden, Jr. ............... 257/495 |

FOREIGN PATENT DOCUMENTS

| JP | 61-125174 | 6/1986 |
| JP | 08-204195 | 8/1996 |
| JP | 10-214969 | 8/1998 |
| JP | 11-103058 | 4/1999 |
| JP | 11-150265 | 6/1999 |

OTHER PUBLICATIONS

Baliga, B.J., "Modern Power Devices", John Wiley and Sons, New York (1987), pp. 79–119 and 263–343.*
U.S. patent application Ser. No. 09/688,154, Yamaguchi et al., filed Oct. 16, 2000.

* cited by examiner

Primary Examiner—Minh Loan Tran
Assistant Examiner—Johannes P Mondt
(74) Attorney, Agent, or Firm—Posz & Bethards, PLC

(57) ABSTRACT

First and second trenches are formed on an n⁺ type substrate at a power MOSFET formation region and a peripheral device formation region, respectively. An n⁻ type epitaxial film, a p type epitaxial film, and an n⁺ type epitaxial film are deposited on the substrate and in the trenches, and then flattening is performed. As a result, an n⁻ type region is provided in the second trench of the peripheral device formation region. Then, a p type well layer is formed in the n⁻ type region by ion-implantation. Accordingly, a power MOSFET and a peripheral device can been formed at the power MOSFET formation region and the peripheral device formation region easily.

11 Claims, 13 Drawing Sheets

SEMICONDUCTOR DEVICE INCLUDING POWER MOSFET AND PERIPHERAL DEVICE AND METHOD FOR MANUFACTURING THE SAME

CROSS REFERENCE TO RELATED APPLICATIONS

This application is based upon and claims the benefit of Japanese Patent Applications No. 2000-79344 filed on Mar. 16, 2000, and No. 2000-79346 filed on Mar. 16, 2000, the contents of which are incorporated herein by reference.

BACKGROUND OF THE INVENTION

1. Field of the Invention

This invention relates to a semiconductor device including a power MOSFET and peripheral devices, and a method for manufacturing the same.

2. Description of Related Art

The Applicant proposes, in Japanese Patent non-published application No. 2000-10350, a semiconductor device (MOSFET) capable of reducing an ON resistance by setting a channel width parallel to a substrate depth direction. The MOSFET adopts an $n^+$ type substrate that functions as a drain region. Meanwhile, it is required to form peripheral devices such as a CMOS for monitoring a temperature, a diode, and a MOSFET for controlling the power MOSFET on one chip together with the power MOSFET described above. That is, these peripheral devices and the power MOSFET are required to be formed on an identical substrate.

Therefore, when the $n^+$ type substrate is used for the power MOSFET, the peripheral devices must be formed in the $n^+$ type substrate other than the region where the power MOSFET is formed. However, this makes it difficult to control concentrations of diffusion layers for the peripheral devices. Further, the peripheral devices must be isolated from the drain region (the $n^+$ type substrate 1) of the power MOSFET.

SUMMARY OF THE INVENTION

The present invention has been made in view of the above problems. An object of the present invention is to make it easier to control a concentration of a diffusion layer for a peripheral device that is formed together with a power MOSFET in an identical substrate. Another object of the present invention is to provide a semiconductor device including a power MOSFET and a peripheral device, which can be formed in an identical substrate by a simplified manufacturing method.

According to a first of the invention, a first conductivity type high-concentration semiconductor substrate has a first trench at a power MOSFET formation region for forming a power MOSFET, and a second trench at a peripheral device formation region for forming a peripheral device. A second conductivity type well layer is disposed in the second trench.

According to a second aspect of the invention, a first conductivity type high-concentration semiconductor substrate has a second conductivity type semiconductor layer thereon. A peripheral device is formed in the semiconductor layer except a region where a power MOSFET is formed. In these semiconductor devices, a concentration of a diffusion resistance of the peripheral device can be controlled easily despite the high-concentration substrate including the power MOSFET and the peripheral device together.

According to a third aspect of the invention, a peripheral device has a similar structure as that of a power MOSFET. Specifically, the peripheral device is a first conductivity type channel MOSFET composed of a well layer of a first conductivity type extending in a semiconductor substrate, a base region of a second conductivity type extending in the well layer, a semiconductor region of the first conductivity type extending in the base region, a trench dividing the semiconductor region into a source region and a drain region, a gate insulating film provided on an inner wall of the trench, and a gate electrode provided on a surface of the gate insulating film and filling the trench.

In this case, the peripheral device can be manufactured at the same manufacturing steps as those for the power MOSFET simultaneously, resulting in a simplified manufacturing method. The peripheral device is not limited to the first conductivity type channel MOSFET as mentioned above, but may be a second conductivity type channel MOSFET. Otherwise, the peripheral device can include both the first conductivity type channel MOSFET and the second conductivity type channel MOSFET, i.e., n-channel MOSFET (nMOS) and p-channel MOSFET (pMOS).

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

Figure 8:
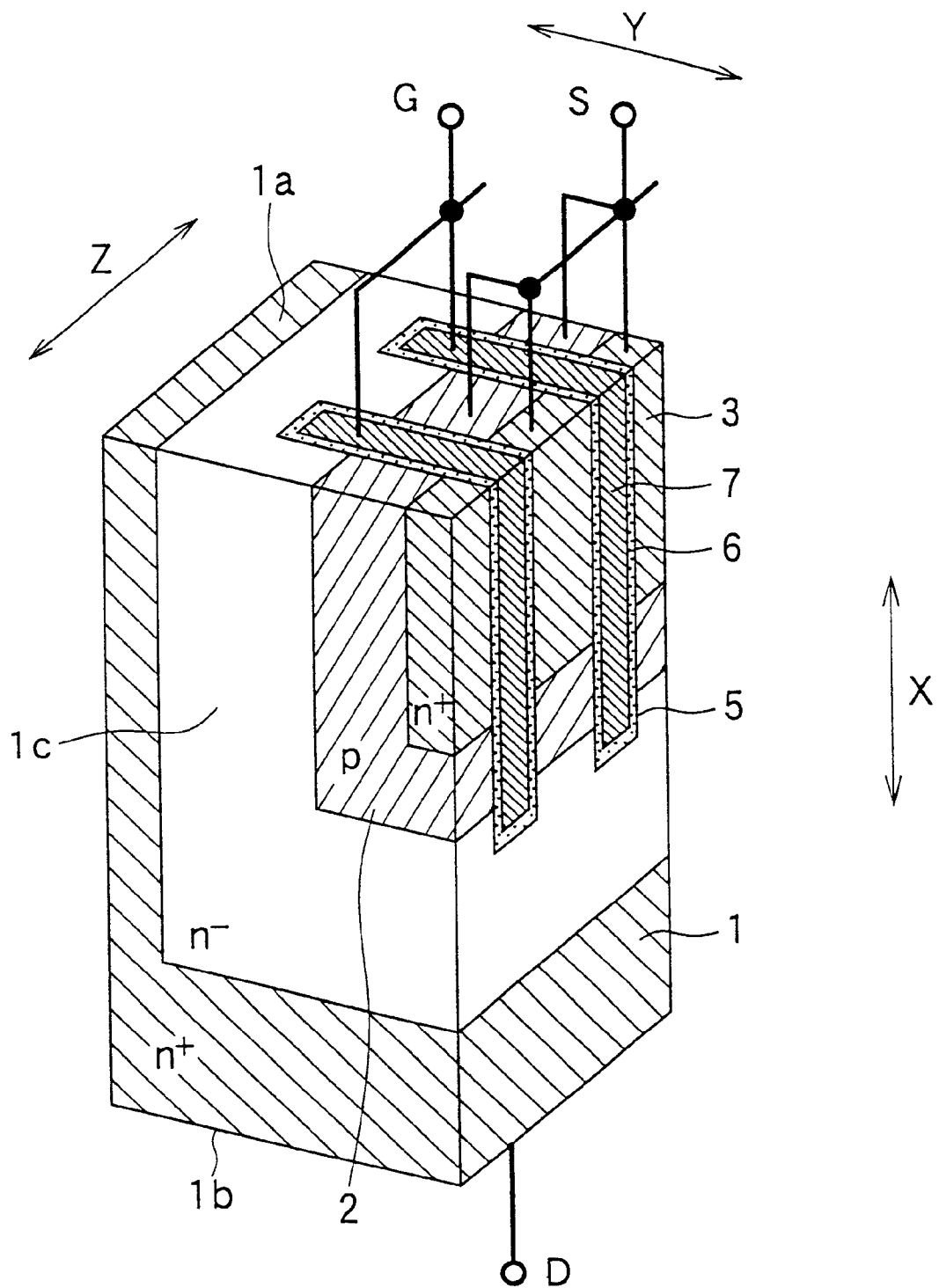
FIG. 8 is a cross-sectional view showing a power MOSFET in the first embodiment, which is substantially the same as that proposed by the applicant in Japanese Patent non-published application No. 2000-10350.

First, a structure of a power MOSFET is explained with reference to FIG. 8. As shown in FIG. 8, the power MOSFET is composed of an $n^+$ type substrate 1 having a main surface 1a and a back surface 1b opposed to the main surface 1a. The thickness direction of the $n^+$ type substrate 1 corresponds to arrowed direction X, and arrowed directions Y and Z in the figure are parallel to the main and back surfaces 1a, 1b of the $n^+$ type substrate 1. The directions X, Y, and Z are perpendicular to one another.

An $n^-$ type drift region 1c is formed in the $n^+$ type substrate 1 to have a specific depth from the main surface 1a, and a p type base region 2 is formed in the $n^-$ type drift region 1c to have a specific depth from the main surface 1a. The depth of the p type base region 2 is about 1 to 100 μm. An $n^+$ type source region 3 is further formed in the p type base region 2 to have a junction depth shallower than that of the p type base region 2. The depth of the $n^+$ type source region 3 is about 1 to 100 μm, but is somewhat shallower than the p type base region 2. The $n^+$ type substrate 1 has an impurity concentration approximately equal to that of the $n^+$ type source region 3, and constitutes a drain region.

Trenches 5 are etched from the main surface 1a of the $n^+$ type substrate 1 perpendicularly, i.e., in a direction approximately parallel to the direction X. The trenches 5 penetrate the $n^+$ type source region 3 and the p type base region 2 in both the direction Y parallel to the main surface 1a and the direction X parallel to the depth direction of the trenches 5. A gate oxide film 6 is formed on the inner walls of the trenches 5, and the insides of the trenches 5 are filled with a gate electrode 7 with the gate oxide film 6 interposed therebetween.

(First Embodiment)

Next, a method for manufacturing a semiconductor device, in which a peripheral device is formed together with the power MOSFET shown in FIG. 8 on the identical $n^+$ type substrate 1, is explained with reference to FIGS. 1A to 1E, and FIGS. 2A to 2E as a first embodiment of the invention.

Figure 1A:
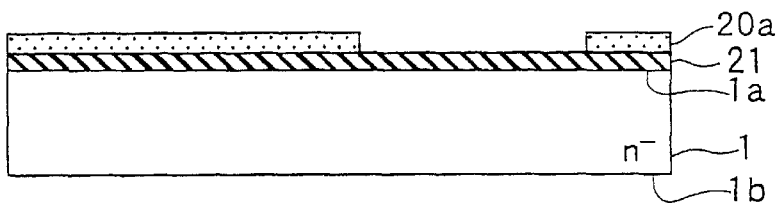
FIGS. 1A to 1E are cross-sectional views showing steps for manufacturing a semiconductor device according to a first embodiment of the invention.

[Step shown in FIG. 1A]

First, the $n^+$ type substrate 1 having the main surface 1a and the back surface 1b is prepared. A (110) Si substrate having an impurity concentration of about $1 \times 10^{19} cm^{-3}$ is used as the $n^+$ type substrate 1 in this embodiment. Then, an oxide film 21 with a thickness of about 1 μm is disposed on the main surface 1a of the $n^+$ type substrate 1, as a mask material, and resist 20a is disposed on the oxide film 21. After that, the resist 20a is opened, in a photo step, above a region where the $n^-$ type drift region 1c is to be formed (i.e., at a drift formation region).

Figure 1B:
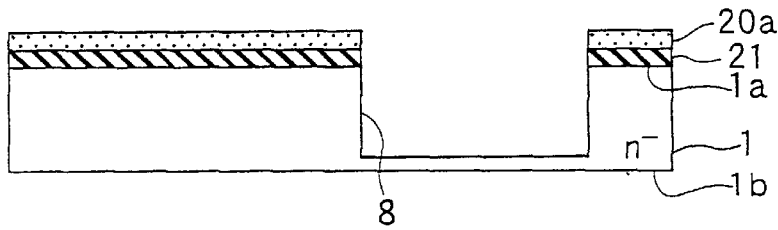

[Step shown in FIG. 1B]

The oxide film 21 is etched using the resist 20a as a mask, and the oxide film 21 is opened at the drift formation region. Successively, a trench (first trench) 8 is formed by performing dry etching to the $n^+$ type substrate 1 at the drift formation region, using the oxide film 21 as a mask.

Instead of the dry etching, the trench 8 may be formed by anisotropic wet etching in this step using, for example, a potassium hydroxide solution or a tetramethylammonium hydroxide solution. When one of these etching solutions is used, the aspect ratio of the trench 8 can be increased by using the (110) Si substrate as the $n^+$ type substrate 1, and by so designing that the sidewalls of the trench 8 are defined by a $(1\bar{1}1)$ plane and a $(\bar{1}1\bar{1})$ plane, or by a $(\bar{1}11)$ plane and a $(1\bar{1}\bar{1})$ plane. This is because the etching rate is small with respect to the $(1\bar{1}1)$, $(\bar{1}1\bar{1})$, $(\bar{1}11)$, and $(1\bar{1}\bar{1})$ planes that are perpendicular to the (110) plane.

Figure 1C:
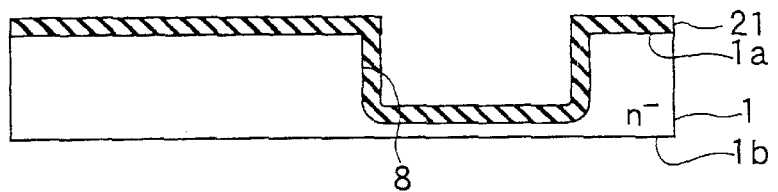

[Step shown in FIG. 1C]

A heat treatment is performed. Accordingly, the inner walls of the trench 8 are thermally oxidized so that an oxide film is formed on the sidewalls of the trench 8 with a thickness of about 500 Å, as a part of the oxide film 21. At that time, the corner portions formed at the trench bottom face and the trench sidewall are rounded by oxidation.

Figure 1D:
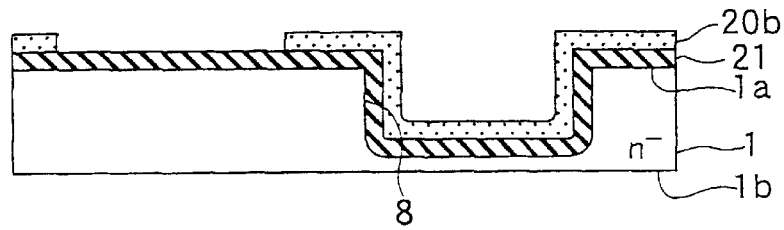

[Step shown in FIG. 1D]

Resist 20b is disposed on the oxide film 21, and is opened at a region where the peripheral device is to be formed (i.e., at a peripheral device formation region).

Figure 1E:
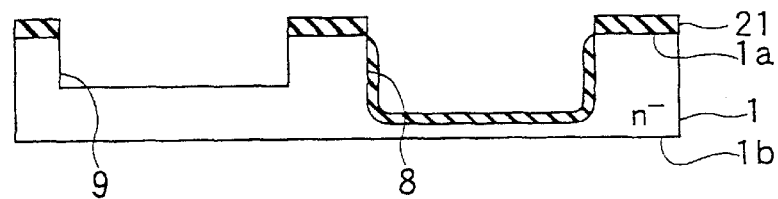

[Step shown in FIG. 1E]

The oxide film 21 is etched using the resist 20b as a mask, and accordingly is opened at the peripheral device formation region. Successively, a trench (second trench) 9 is formed at the peripheral device formation region by performing dry etching using the oxide film 21 as a mask. This trench formation may be performed by anisotropic wet etching as in the step shown in FIG. 1B to achieve the same advantages as described above.

Figure 2A:
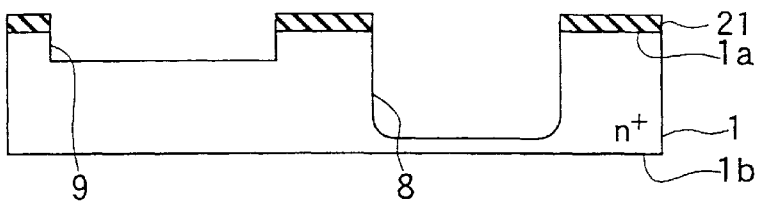
FIGS. 2A to 2E are cross-sectional views showing steps following the steps shown in FIGS. 1A to 1E.

[Step shown in FIG. 2A]

The oxide film 21 is further etched using hydrogen fluoride (HF) so that a part of the film 21 having a thickness of about 500 Å is removed. As a result, the oxide film 21 remains only on the main surface 1a of the $n^+$ type substrate 1, and the $n^+$ type substrate 1 is exposed on the sidewalls of the trenches 8, 9.

Figure 2B:
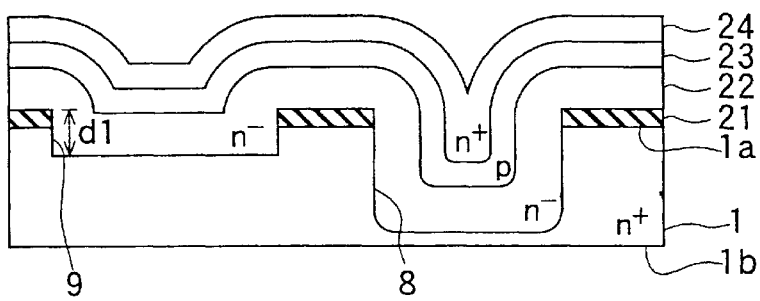

[Step shown in FIG. 2B]

An $n^-$ type epitaxial film (first semiconductor film) 22, an p type epitaxial film (second semiconductor film) 23, and an $n^+$ type epitaxial film (third semiconductor film) 24 are grown in sequence on the main surface 1a as well as on the sidewalls of the trenches 8, 9. At that time, the thickness of the $n^-$ type epitaxial film 22 is controlled to be larger than depth d1 of the trench 9 so that the p type epitaxial film 23 does not get into the trench 9. Incidentally, because the corner portions of the trench 8 are rounded, the corner portions of the $n^-$ type epitaxial film 22 and the p type epitaxial film 23 are also rounded above the trench 8. This is effective to relax electric field concentrations thereon.

Figure 2C:
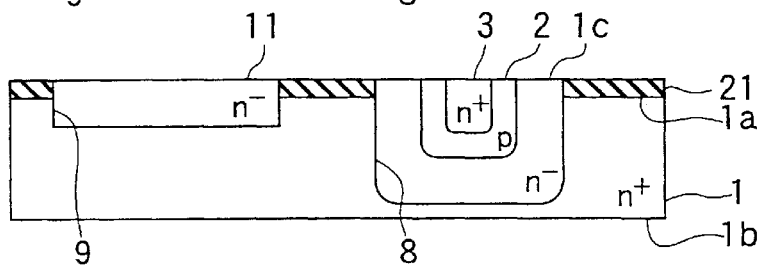

[step shown in FIG. 2C]

Etching-back is performed to the $n^-$ type epitaxial film 22, the p type epitaxial film 23, and the $n^+$ type epitaxial film 24, using the oxide film 21 as an etching stopper. As a result, the regions where the power MOSFET and the peripheral device are to be formed are flattened. At the region where the power MOSFET is to be formed (i.e., at the power MOSFET formation region), the $n^-$ type drift region 1c is made up of the $n^-$ type epitaxial film 22, the p type base region 2 is made up of the p type epitaxial film 23, and the $n^+$ type source region 3 is made up of the $n^+$ type epitaxial film 24. On the other hand, at the region where the peripheral device is to be formed, an $n^-$ type region (semiconductor layer) 11 is made up of the $n^-$ type epitaxial film 22. Incidentally, although the case of performing the etch-back is explained here, the flattening may be performed by polishing using the oxide film 21 as a film for detecting an end point, or by wet etching and finishing polishing.

Figure 2D:
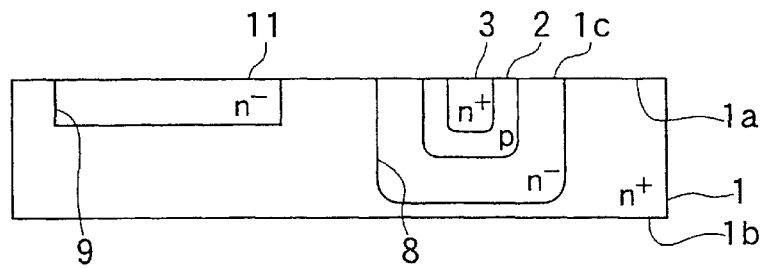

[Step shown in FIG. 2D]

After the surface portions of the n⁻ type drift region 1c, the p type base region 2, the n⁺ type source region 3, and the n⁻ type region 11 are oxidized sacrificially, the sacrificially oxidized portions are removed by etching. Accordingly, the main surface 1a of the n⁺ type substrate are flattened almost at an entire region thereof.

The oxide film 21 on the main surface 1a of the n⁺ type substrate 1 may be removed before the growths of the epitaxial films. In this case, substantially the same structure as described above can be attained by controlling polishing rates of the epitaxial films 22, 23 and 24 or by measuring the thickness of the substrate at the flattening step, without performing the sacrificial oxidation treatment.

Figure 2E:
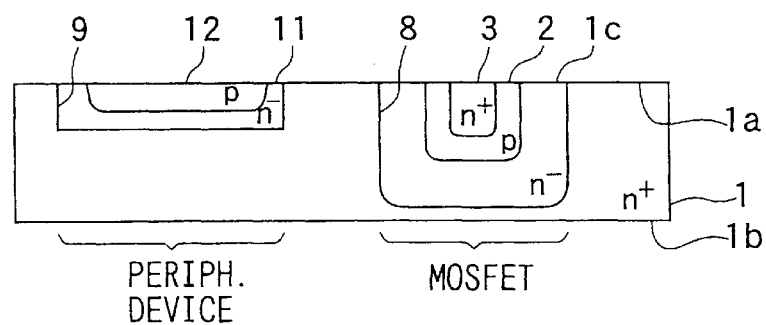

[Step shown in FIG. 2E]

Then, a p type well layer 12 is formed in a surface portion of the n type region 11 by ion-implantation or the like. Accordingly, the p type well layer 12 is formed at a position separated from the n⁺ type substrate 1. In this p type well layer 12, the peripheral device such as a CMOS or a diode is formed.

According to the structure described above, the n⁻ type region 11 having an impurity concentration lower than that of the n⁺ type substrate 1 extends between the p type well layer 12 and the high concentration n⁺ type substrate 1. Because of this, a depletion layer formed between the p type well layer 12 and the n⁻ type region 11 can easily extends to the side of the n⁻ type region 11, so that the withstand voltage of the p type well layer 12 can be improved.

After that, although steps are not shown specifically, as shown in FIG. 8, the trenches 5 are etched from the main surface 1a of the n⁺ type substrate 1 vertically, the gate oxide film 6 is formed on the surfaces of the trenches 5, and the gate electrode 7 is formed on the gate oxide film 6. In consequence, the power MOSFET shown in FIG. 8 is completed.

Thus, according to the present embodiment, the trench 8 for forming the power MOSFET and the trench 9 for forming the peripheral device are formed on the same substrate 1, and the p type well layer 12 of a conductivity type inverse to that of the n⁺ type substrate 1 is formed in the trench 9. Therefore, a concentration of a diffusion resistance of the peripheral device can be controlled easily, and there is no need to isolate the peripheral device formation region from drain of the power MOSFET specially.

Although it is explained that the trench 8 for forming the power MOSFET and the trench 9 for forming the peripheral device are formed in the present embodiment, the present embodiment is applicable to a case where more than two trenches are formed on the n⁺ type substrate 1. The same advantages described above can be attained by forming at least two trenches having different sizes on the n⁺ type substrate 1 and by forming, in one of the trenches for forming the peripheral device, a semiconductor layer (the p type well layer 12 in this embodiment) of a conductivity type different from that of the substrate 1.

(Second Embodiment)

Figure 3:
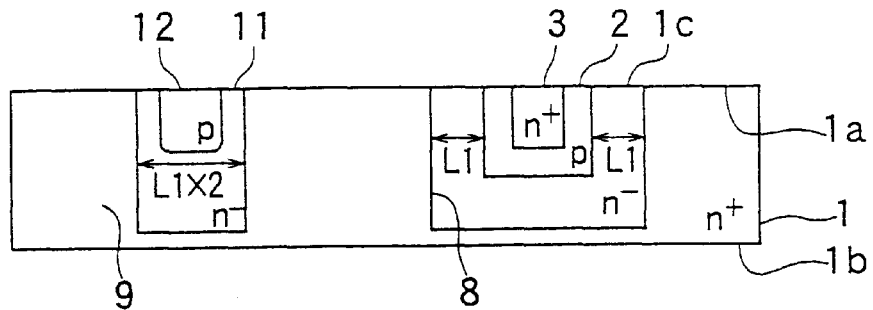
FIG. 3 is a cross-sectional view showing a semiconductor device in a second embodiment.

FIG. 3 shows a cross-sectional structure of a semiconductor device to which a second embodiment of the invention is applied. In the first embodiment, as shown in FIGS. 1A to 1E, the trench 8 and the trench 9 are formed separately from each other. As opposed to this, in the second embodiment, at the step shown in FIG. 1B, the oxide film 21 is opened not only at the power MOSFET formation region but also at the peripheral device formation region, and the trenches 8 and 9 are formed at the same time. In this case, as shown in FIG. 3, the depth of the trench 9 is equal to that of the trench 8. Therefore, the width of the trench 9 is set to be less than twice (L1×2) as large as thickness L1 of the n⁻ type epitaxial film 22 so as to prevent the p type epitaxial film 23 from getting into the trench 9.

Thus, when the trench 8 and the trench 9 are formed simultaneously, not only the formation step of the trenches 8, 9 but also the manufacturing process of the semiconductor device can be simplified. Further, because the p type well layer 12 and the p type base region 2 can be formed with different concentrations from each other, the concentration of the p type well layer 12 can be controlled desirably.

(Third Embodiment)

Figure 4:
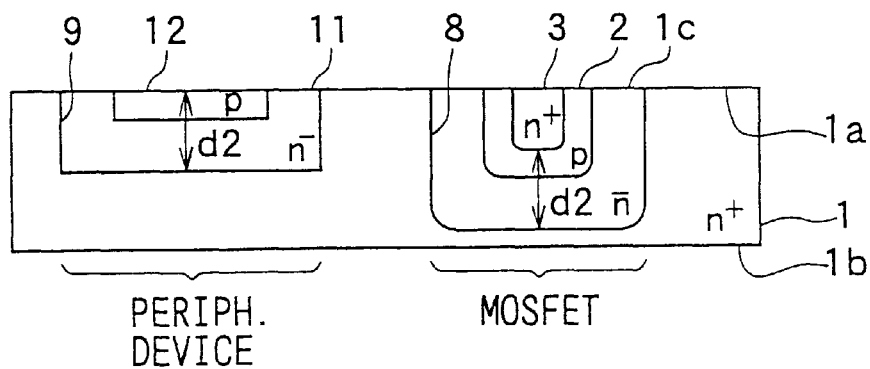
FIG. 4 is a cross-sectional view showing a semiconductor device in a third embodiment.

FIG. 4 shows a cross-sectional structure of a semiconductor device to which a third embodiment of the invention is applied. In the first embodiment, as shown in FIG. 2B, only the n⁻ type epitaxial film 22 is disposed in the trench 9. To the contrary, in the third embodiment, the n⁻ type epitaxial film 22 and the p type epitaxial film 23 are disposed in the trench 9. In the semiconductor device having the structure as described above, in the step shown in FIG. 1E, the trench 9 is formed with a depth d2 that allows both the n⁻ type epitaxial film 22 and the p type epitaxial film 23 to be disposed in the trench 9. The semiconductor device in this embodiment also can be manufactured by the same manufacturing method as that of the first embodiment.

In the third embodiment, the p type well region 12 is formed from the p type epitaxial film 23. Therefore, unlike the first embodiment, ion-implantation needs not be performed to form the p type well region 12. This embodiment is especially preferable in the case where the p type base region 2 and the p type well region 12 may have the same impurity concentration as each other.

(Fourth Embodiment)

Figure 5:
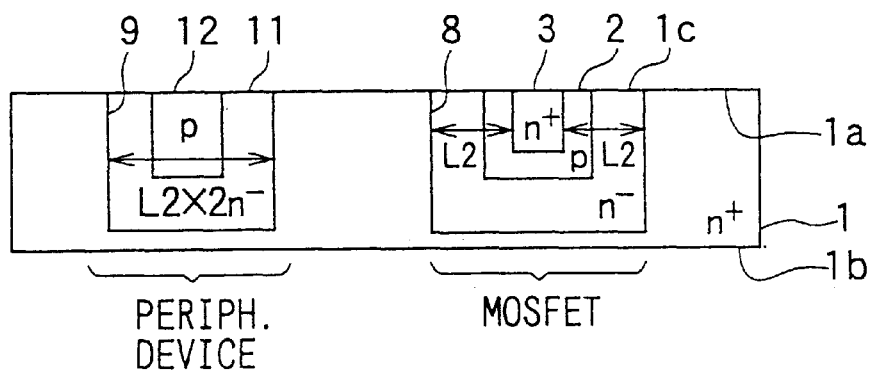
FIG. 5 is a cross-sectional view showing a semiconductor device in a fourth embodiment.

FIG. 5 shows a cross-sectional structure of a semiconductor device to which a fourth embodiment of the invention is applied. The present embodiment is a combination of the second and third embodiments. That is, the trenches 8, 9 are formed simultaneously, and both the n⁻ type epitaxial film 22 and the p type epitaxial film 23 are disposed in the trench 9. Accordingly, the formation step of the trenches 8, 9 is simplified, and there is no need to perform ion-implantation for forming the p type well region 12.

The semiconductor device having the above-mentioned structure can be manufactured by the same method as that of the first embodiment when the width of the trench 9 is set to be twice or less than twice (L2×2) as large as thickness L2 that is the sum of the thickness of the n⁻ type epitaxial film 22 and the thickness of the p type epitaxial film 23. In this case, however, it is necessary that the width of the trench 9 is more than twice (L1×2) as large as the thickness L1 of the n⁻ type epitaxial film 22, unlike the second embodiment.

(Fifth Embodiment)

Figure 6A:
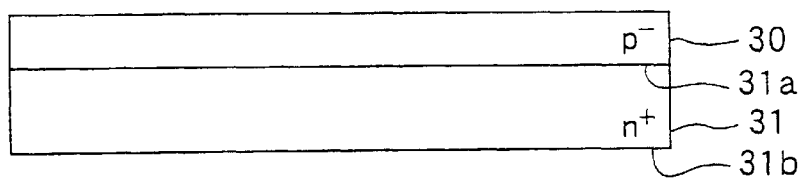
FIGS. 6A to 6C are cross-sectional views showing steps for manufacturing a semiconductor device in a fifth embodiment.
Figure 6B:
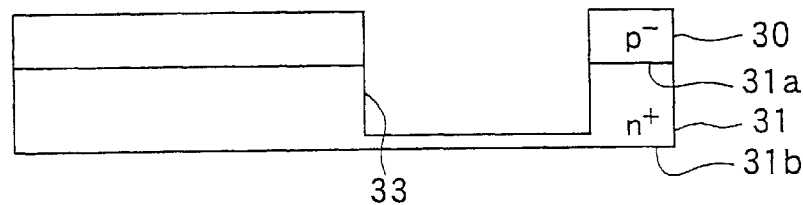

FIGS. 6A to 6B show a manufacturing method of a semiconductor device in a stepwise manner according to a fifth embodiment of the invention. Hereinafter, the manufacturing method of the semiconductor device is explained with reference to the figures.

[Step shown in FIG. 6A]

First, an n⁺ type substrate 31 having a main surface 31a and a back surface 31b is prepared. In this embodiment, a (110) Si substrate having an impurity concentration of about $1\times10^{19}$ cm⁻³ is used as the n⁺ type substrate 31. Then, a p⁻ type epitaxial layer 30 is deposited on the main surface 31a of the n⁺ type substrate 31.

[Step shown in FIG. 6B]

After a mask having an opening where the n⁻ type drift region 1c is to be formed is formed in a photo-step, a trench 33 is formed in the p⁻ type epitaxial layer 30 and the n⁺ type substrate 31 by dry etching using the mask. Then, the mask is removed.

Although the trench 33 is formed by dry etching, it may be formed by anisotropic wet etching using a potassium hydroxide solution or a tetramethylammonium hydroxide solution. When one of these etching solutions is used, an aspect ratio of the trench 33 can be increased by using the (110) Si substrate as the n⁺ type substrate 31, and by so designing that the sidewalls of the trench 33 are defined by a (1$\bar{1}$1) plane and a ($\bar{1}$1$\bar{1}$) plane, or by a ($\bar{1}$11) plane and a (1$\bar{1}\bar{1}$) plane. This is because the etching rate is small with respect to the (1$\bar{1}$1), ($\bar{1}$1$\bar{1}$), ($\bar{1}$11), and (1$\bar{1}\bar{1}$) planes that are perpendicular to the (110) plane.

Figure 6C:
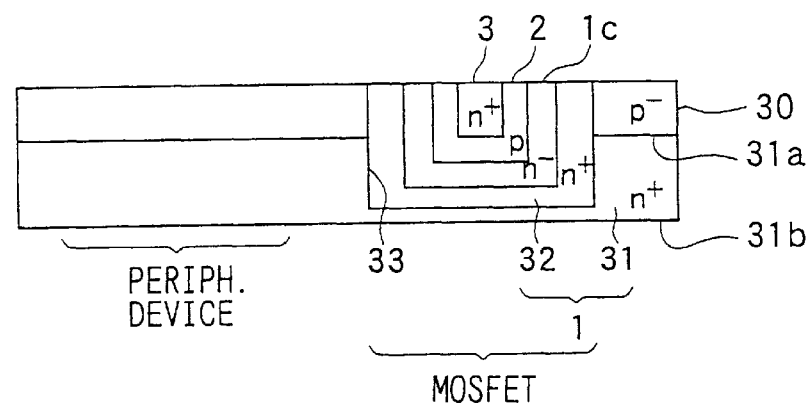

[Step shown in FIG. 6C]

Next, an n⁺ type epitaxial film 32 is deposited, so that the sidewalls of the trench 33 are covered with the n⁺ type epitaxial film 32. The n⁺ type epitaxial film 32 and the n⁺ type substrate 31 work as a drain (corresponding to the n⁺ type substrate 1 in the first embodiment) of the power MOSFET. Then, substantially the same steps as in the first embodiment shown in FIG. 2B and following it are performed. Accordingly, the n⁻ type drift region 1c, the p type base region 2, and the n⁺ type source region 3 are formed.

The semiconductor device described above is so constructed that the p⁻ type epitaxial layer 30 is disposed at the region where the peripheral device is to be formed (peripheral device formation region). The p⁻ type epitaxial layer 30 therefore corresponds to the p type well layer 12 in FIG. 1. Because of this, the concentration of the diffusion resistance of the peripheral device can be controlled easily by controlling the conditions for depositing the p⁻ type epitaxial layer 30. In this semiconductor device, because the peripheral device is not formed on the n⁺ type substrate 31 directly, it is not necessary to specially isolate the peripheral device formation region from the drain of the power MOSFET.

Further, because the trench 33 is formed at the region where the power MOSFET is to be formed (MOSFET formation region) and no trench is formed at the peripheral device formation region, only one mask is used for the trench formation. The thickness of the peripheral device formation region (here, the p⁻ type epitaxial layer 30) can be set arbitrarily. This means that various kinds of peripheral devices can be formed at that region. Furthermore, it is not necessary to perform ion-implantation for forming the p type well layer 12 when the concentration of the p⁻ type epitaxial layer 30 is controlled to be a desirable value.

Meanwhile, in the present embodiment, the n⁻ type drift region 1c is surrounded with the n⁺ type epitaxial film 32. This is to efficiently form a current path by forming a drain part in that portion contacting the p⁻ type epitaxial layer 30. Because the thickness of the p⁻ type epitaxial layer 30 is very thin as compared to the depth of the trench 33 (channel width of the power MOSFET), there is a case where the n⁺ type epitaxial film 32 may not be formed.

(Sixth Embodiment)

Figure 7A:
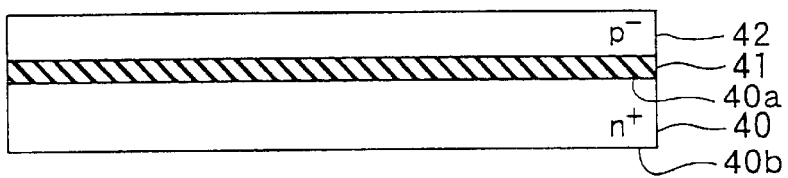
FIGS. 7A to 7C are cross-sectional views showing steps for manufacturing a semiconductor device in a sixth embodiment.
Figure 7B:
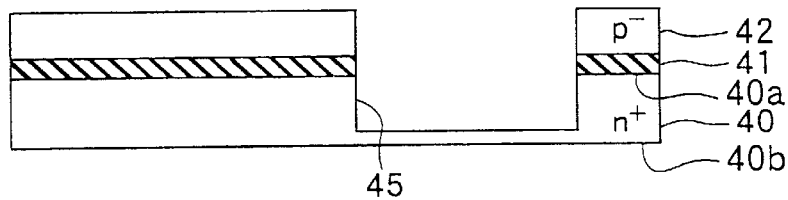
Figure 7C:
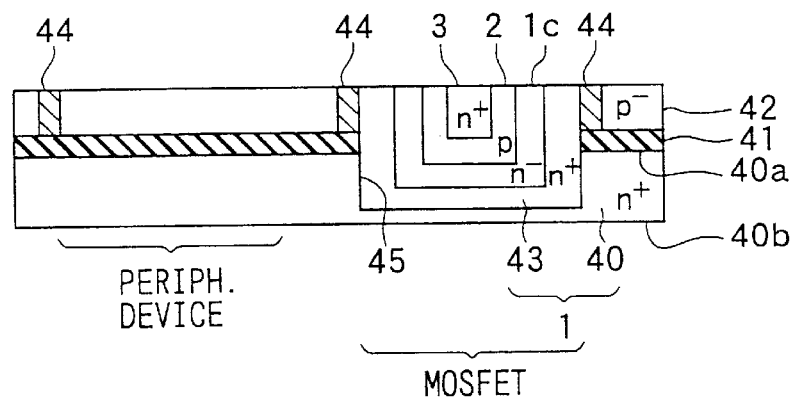

FIGS. 7A to 7C show a manufacturing method of a semiconductor device in a stepwise manner according to a sixth embodiment of the invention. Hereinafter, the manufacturing method of the semiconductor device is explained with reference to the figures.

[Step shown in FIG. 7A]

First, an n⁺ type substrate 40 having a main surface 40a and a back surface 40b is prepared. A (110) Si substrate having an impurity concentration of about $1 \times 10^{19} \text{cm}^{-3}$ is used as the n⁺ type substrate 40 in this embodiment. Then, a p⁻ type epitaxial layer 42 is deposited on the main surface 40a of the n⁺ type substrate 40 with an insulating film 41 (for example, oxide film) interposed therebetween. Accordingly, an SOI substrate composed of the n⁺ type substrate 40, the insulating film 41, and the p⁻ type epitaxial layer 42 is constructed.

[Step shown in FIG. 7B]

Next, after a mask having an opening where the n⁻ type drift region 1c is to be formed is formed in a photostep, etching is performed using the mask to form a trench 45. At that time, the dry etching similar to that in the step shown in FIG. 1B is performed to etch the p⁻ type epitaxial layer 42 and the n⁺ type substrate 40, and either of dry etching and wet etching using HF or the like is performed to etch the insulating film 41. Then, the mask is removed.

Incidentally, wet etching may be performed to etch the p⁻ type epitaxial layer 42 and the n⁺ type substrate 40, instead of the dry etching as in the fifth embodiment. Likewise, the aspect ratio of the trench 45 can be increased by using the (110) Si substrate as the n⁺ type substrate 40, and by so designing that the sidewalls of the trench 45 are defined by a (1$\bar{1}$1) plane and a ($\bar{1}$1$\bar{1}$) plane, or by a ($\bar{1}$11) plane and a (1$\bar{1}\bar{1}$) plane.

[Step shown in FIG. 7C]

Next, an n⁺ type epitaxial film 43 is deposited, so that the sidewalls of the trench 45 are covered with the n⁺ type epitaxial film 43. The n⁺ type epitaxial film 43 and the n⁺ type substrate 40 work as the drain (corresponding to the n⁺ type substrate 1 in the first embodiment) of the power MOSFET. Then, substantially the same steps as those shown in FIG. 2B and following it are performed. As a result, the n⁻ type drift region 1, the p type base region 2, an the n⁺ type source region 3 are provided.

Thus, even in the case where the semiconductor device is fabricated by using the SOI substrate as above, since the p⁻ type epitaxial layer 42 is disposed at the peripheral device formation region, the same advantages as in the fifth embodiment can be attained. Incidentally, in the case of using the SOI substrate, respective devices formed in the SOI substrate are electrically isolated from one another by an insulating film 44. In this connection, when the power MOSFET is surrounded with this insulating film 44, the electrical isolation can be attained more securely.

In the first to fifth embodiments as described above, because the peripheral device and the power MOSFET are isolated from each other, a special step for obtaining the device isolation is not performed. However, a LOCOS isolation or STI (Shallow Trench Isolation) may be performed to make the device isolation more secure.

In each of the embodiments, the three-layered structure composed of the n⁻ type drift region 1c, the p type base region 2, and the n⁺ type source region 3 is formed by depositing the three epitaxial films 22 to 24; however, it may be formed as follows. For example, the n⁻ type epitaxial film 22 is formed to have a larger thickness, and a p type film containing p type impurities is deposited on the surface of the n⁻ type epitaxial film 22. The surface portion of the n⁻ type epitaxial film 22 is then inverted into a p type by solid phase diffusion from the p type film so that the p type base region 2 is formed. Instead of solid phase diffusion, p type impurities may be diffused into the n⁻ type epitaxial film 22 at a gaseous phase or a liquid phase.

(Seventh Embodiment)

Next, a seventh embodiment of the present invention is explained. In this and following embodiments, a peripheral device has a structure similar to that of a power MOSFET, and therefore, can be manufactured at the same manufacturing steps as those for the power MOSFET on an identical substrate.

Figure 16:
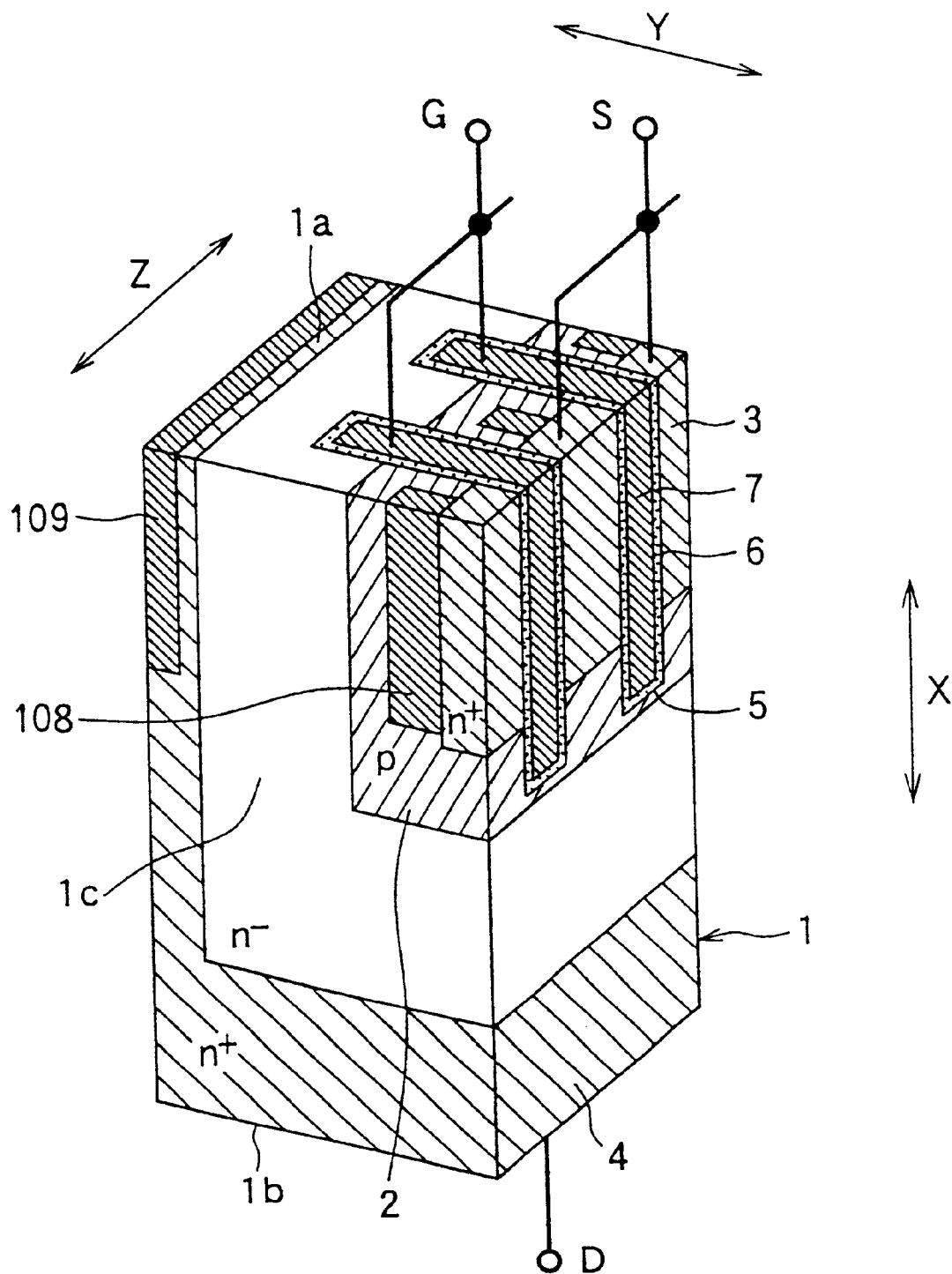
FIG. 16 is a perspective cross-sectional view showing a power MOSFET in the seventh and eighth embodiments.

FIG. 16 shows the power MOSFET adopted in this embodiment. The power MOSFET has a structure substantially the same as that shown in FIG. 8 except that the trenches 5 do not penetrate the p type base region 2 in the direction X (the trenches 5 have end portions in the p type base region 2), and that high-concentration contact regions 108, 109 are provided. The high-concentration contact regions 108, 109 extend in the p type base region 2 and the n⁺ type substrate 1, respectively, from the main surface 1a in a vertical direction (depth direction) so that internal resistances of the p type base region 2 and the n⁺ type substrate 1 are reduced in the depth direction.

Next, the semiconductor device including the power MOSFET and the peripheral device according to the seventh embodiment is explained with reference to FIG. 9, in which the same parts as those in FIG. 16 are designated with the same reference numerals.

The semiconductor device has power MOSFETs and peripheral devices that are formed on an identical n⁺ type substrate 1. The power MOSFETs are formed at region (power MOSFET formation region) A of the n⁺ type substrate 1, and the peripheral devices are formed at region (peripheral device formation region) B thereof.

Figure 9:
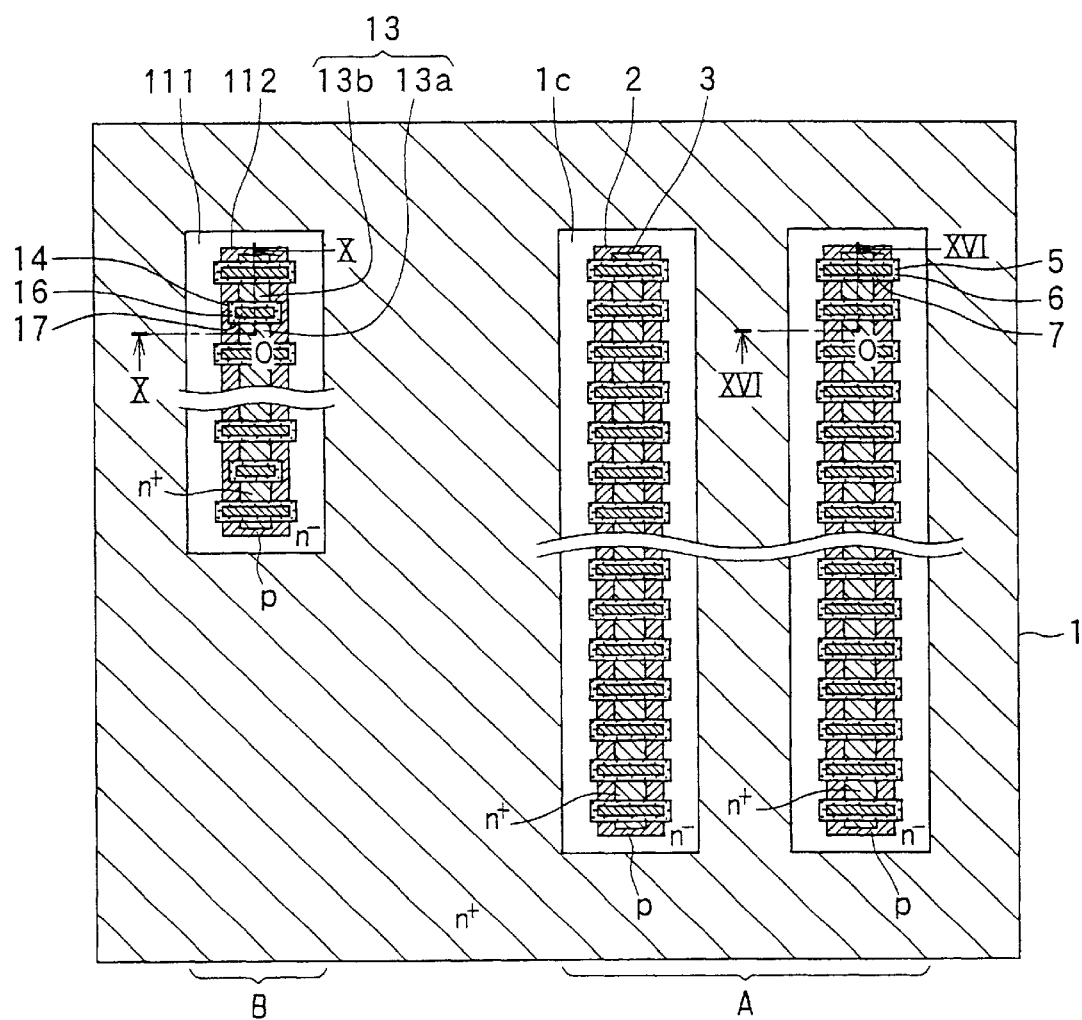
FIG. 9 is a diagram schematically showing a layout of a semiconductor device according to a seventh embodiment of the invention.
Figure 10:
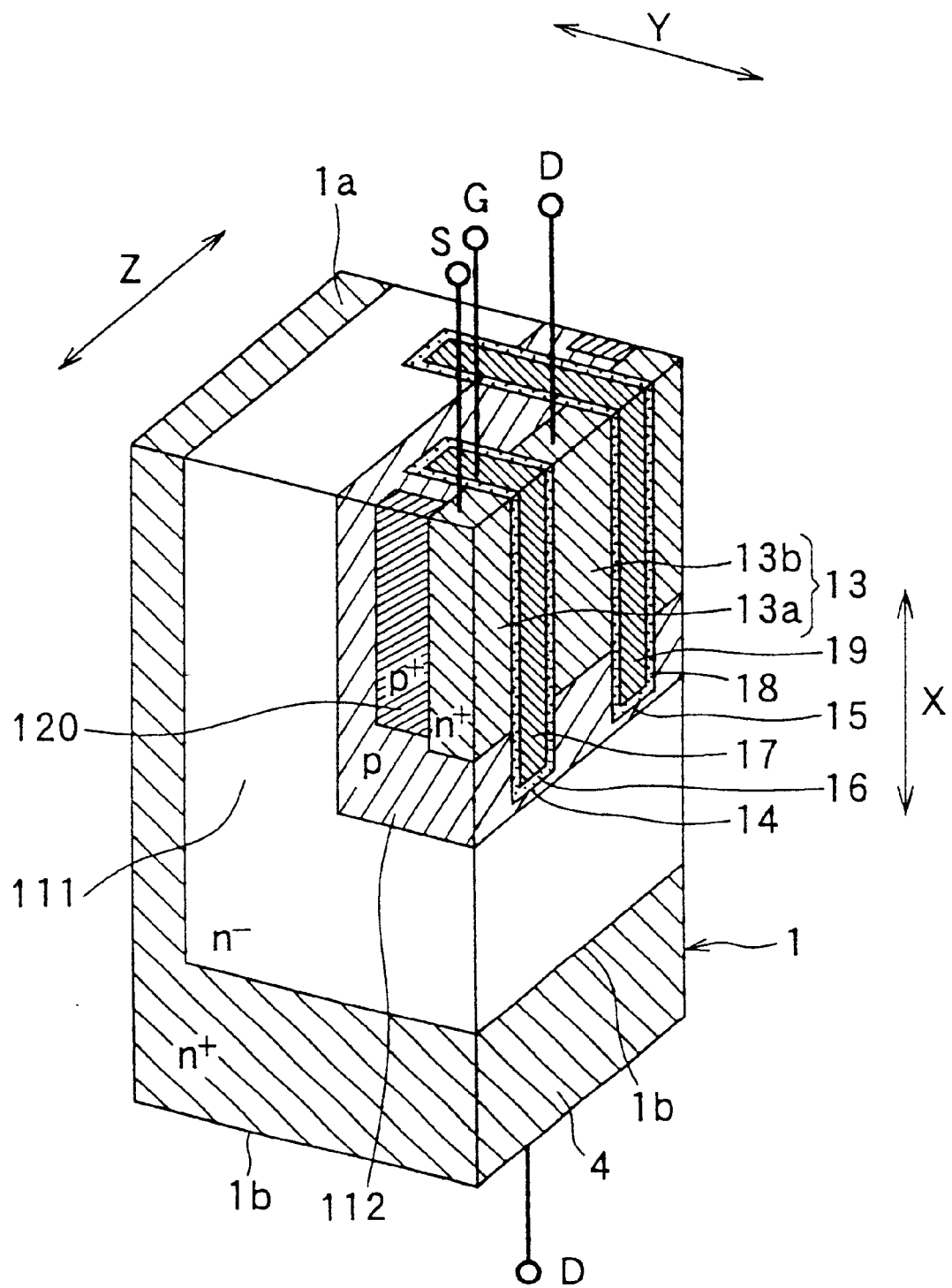
FIG. 10 is a perspective cross-sectional view showing the semiconductor device along lines X-O-X in FIG. 9.

FIG. 16 corresponds to a cross-section taken along lines XVI-O-XVI in FIG. 9, and each of the power MOSFETs provided continuously at the power MOSFET formation region A has the structure shown in FIG. 16. At the peripheral device formation region B, n-channel MOSFETs are formed as peripheral devices for, for example, controlling the power MOSFETs. FIG. 10 shows a cross-section taken along lines X-O-X in FIG. 9. The structure of one of the n-channel MOSFETs as a peripheral device is explained below based on this figure.

This MOSFET as well as the power MOSFET is formed on the n⁺ type substrate 1 having the main surface 1a and the back surface 1b. Arrowed direction X corresponds to the thickness direction of the n⁺ type substrate 1, and arrowed directions Y and Z correspond to directions parallel to the main surface 1a and the back surface 1b of the n⁺ type substrate 1. The directions X, Y, and Z are perpendicular to one another.

An n⁻ well layer 111 is formed with a specific depth from the main surface 1a of the n⁺ type substrate 1, and a p type base region 112 is formed in the n⁻ type well layer 111 to have a specific depth from the main surface 1a of the n⁺ type substrate 1. The depth of the p type base region 112 is about 1 to 100 μm. An n⁺ type region 13 is further formed in the p type base region 112 from the main surface 1a of the n⁺ type substrate 1 to have a junction depth shallower than that of the p type base region 112. The depth of the n⁺ type region 13 is about 1 to 100 μm, but is somewhat shallower than that of the p type base region 112.

Trenches 14, 15 are dug from the main surface 1a of the n⁺ type substrate 1 perpendicularly, i.e., in parallel with the direction X. The trench 14 extends in the direction Y parallel to the main surface 1a to reach the p type base region 112 while passing through the n⁺ type region 13, and extends in the direction X parallel to the depth direction thereof to pass through the n⁺ type region 13 and to reach the p type base region 112. As a result, the n⁺ type region 13 is divided, in the direction Z, into a source region 13a and a drain region 13b. Further, a gate oxide film (gate insulating film) 16 is formed on the surface of the trench 14, and a gate electrode 17 made of poly silicon is embedded inside the trench 14 through the gate oxide film 16.

On the other hand, the trench (isolation trench) 15 is formed to penetrate both the n⁺ type region 13 and the p type base region 112 in the direction Y parallel to the main surface 1a of the n⁺ type substrate 1. In the direction X parallel to the depth direction of the trench 15, the trench 15 penetrates the n⁺ type region 13 to reach the p type base region 112. An oxide film (isolation insulating film) 18 is formed on the surface of the trench 15, and the inside of the trench 15 is filled with a poly-silicon layer 19 with the oxide film 18 interposed. As shown in FIG. 9, although the MOSFETs are provided continuously, the respective MOSFETs are isolated from each other by the trench 15 and the oxide film 18. Incidentally, a high-concentration contact region 120 is provided in the p type base region 112, which extends perpendicularly from the main surface 1a so that the internal resistance of the p type base region 112 is reduced in the depth direction.

The above-mentioned MOSFET is operated as follows.

Figure 11:
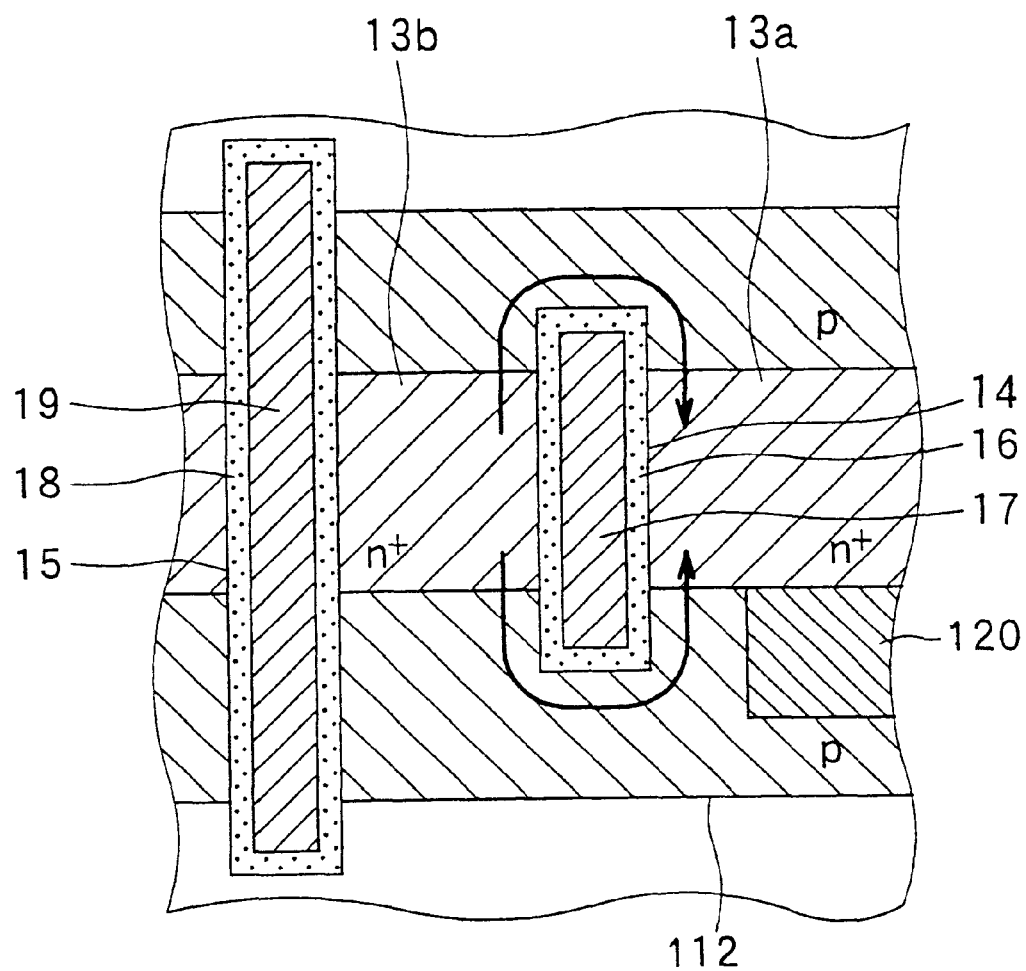
FIG. 11 is a schematic view for explaining an operation of an n-channel MOSFET as a peripheral device in the seventh embodiment.

Referring to FIG. 11 showing an operational state of the MOSFET, because the trench 14 passes through the n⁺ type region 13, a channel region is formed to surround the protruding portions protruding from the n⁺ type region 13. Accordingly, a current flows between the source region and the drain region when a driving voltage is applied to the gate electrode 17.

Thus, when the peripheral device formed on the same substrate as the power MOSFET has the above-mentioned structure similar to that of the power MOSFET, the power MOSFET and the peripheral device can be produced at the same manufacturing steps.

Next, after the manufacturing steps for the power MOSFET are explained, the method for manufacturing the semiconductor device is explained in comparison with the manufacturing steps for the power MOSFET and the manufacturing steps for the peripheral device. The manufacturing steps for the power MOSFET are explained with reference to FIG. 16.

The manufacture of the power MOSFET shown in FIG. 16 is, for example, performed as follows. First, the trench is formed on the n⁺ type substrate 1 where the n⁻ type drift region 1c is to be formed. Then, three layers composed of an n⁻ type epitaxial film, a p type epitaxial film, and an n⁺ type epitaxial film are deposited on the main surface 1a of the n⁺ type substrate 1 including the trench, and the surface of the three layers is flattened. Accordingly, the n⁻ type drift region 1c, the p type base region 2, and the n⁺ type source region 3 are provided. Successively, after the trenches 5 are formed, the inner walls of the trenches 5 are thermally oxidized to form the gate oxide film 6. On the gate oxide film 6, a poly silicon layer is deposited to form the gate electrode 7. The contact regions 108, 109 are formed by ion-implantation performed through the main surface 1a. In consequence, the power MOSFET is completed.

The manufacturing steps for the peripheral device can be performed simultaneously with the above-mentioned manufacturing steps for the power MOSFET as follows.

First, when the trench is formed where the n⁻ type drift region 1c is formed, a trench is also formed at a region where the n⁻ type well region 111 is to be formed. Then, the three epitaxial films are deposited to fill both the trenches, and the flattening step described above is performed. Accordingly, the n⁻ type well layer 111, the p type base region 112, and the n⁺ type region 13 can be formed simultaneously at the steps for forming the n⁻ type drift region 1c, the p type base region 2, and the n⁺ type source region 3.

Further, the trenches 14, 15 are formed simultaneously when the trenches 5 are formed. The gate oxide film 16 and the oxide film 18 are formed during the thermal oxidation for forming the gate oxide film 6. The gate electrode 17 and the poly silicon layer 19 are formed simultaneously when the gate electrode 7 is formed. Thus, the trenches 5 and the trenches 14, 15 can be formed at the same step, the gate oxide film 6, the gate oxide film 16, and the oxide film 18 can be formed at the same step, and the gate electrode 7, the gate electrode 17, and the poly silicon layer 19 can be formed at the same step.

Because the power MOSFET and the peripheral device can be manufactured at the same steps, the manufacturing method of the semiconductor device can be simplified. Incidentally, although the manufacturing method of the semiconductor device is exemplified as above, it may be modified appropriately provided that each step can be performed for forming both the power MOSFET and the peripheral device.

(Eighth Embodiment)

Figure 12:
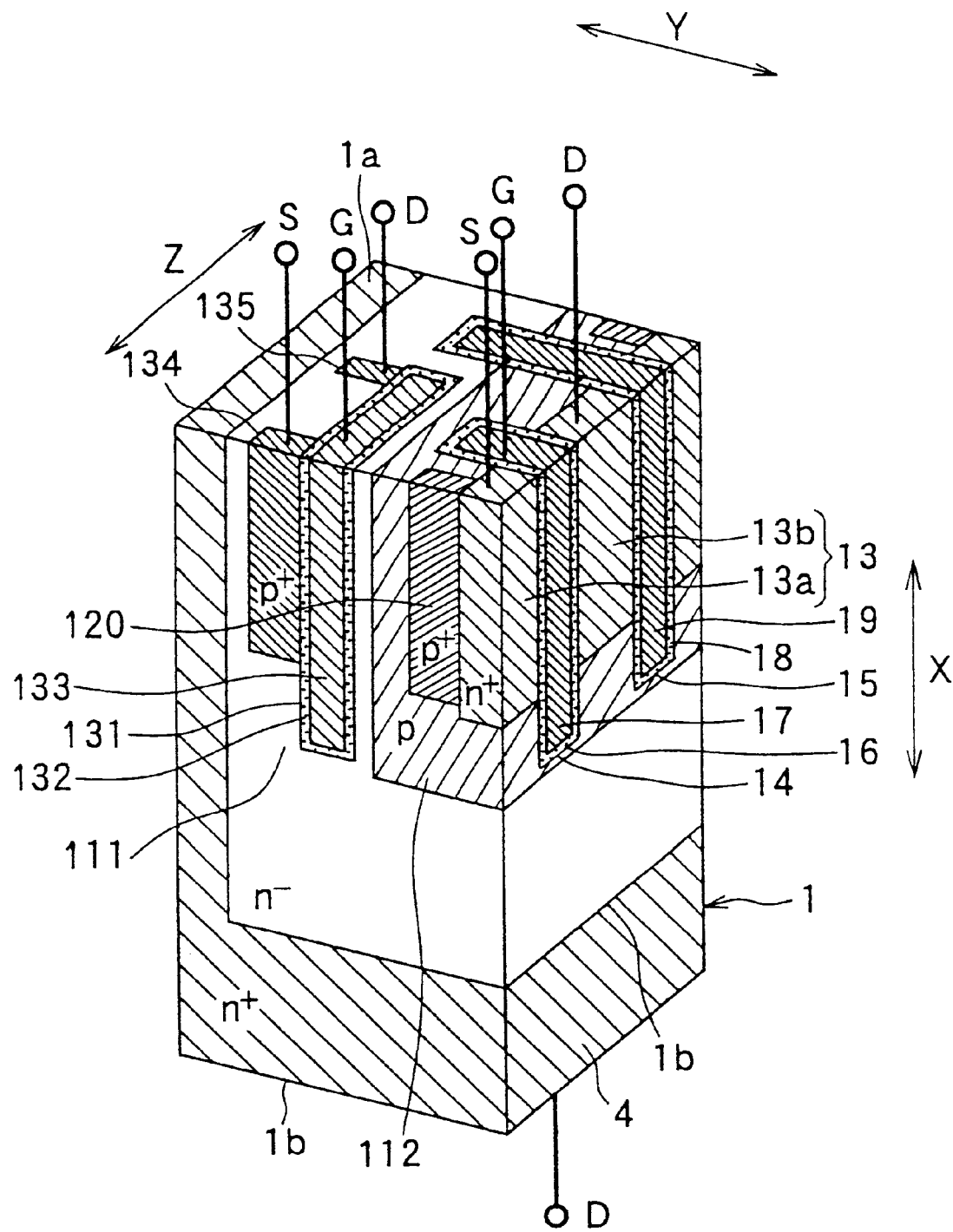
FIG. 12 is a perspective cross-sectional view showing a peripheral device according to an eighth embodiment of the invention.

FIG. 12 shows a semiconductor device to which an eighth embodiment of the invention is applied. In the seventh embodiment, the n-channel MOSFET is formed as a peripheral device; however, in this embodiment, a CMOS including not only an n-channel MOSFET (nMOS) but also a p-channel MOSFET (PMOS) is formed as a peripheral device. The n-channel MOSFET has a structure substantially the same as that explained in the seventh embodiment. Therefore, the p-channel MOSFET is mainly explained below.

As shown in FIG. 12, a trench 131 is formed in the n⁻ type well region 111 to extend perpendicularly to the main surface 1a. A gate oxide film 132 is formed on the inner wall of the trench 131, and a gate electrode 133 made of poly silicon is embedded in the trench 131 with the gate oxide film 132 interposed therebetween.

Figure 13:
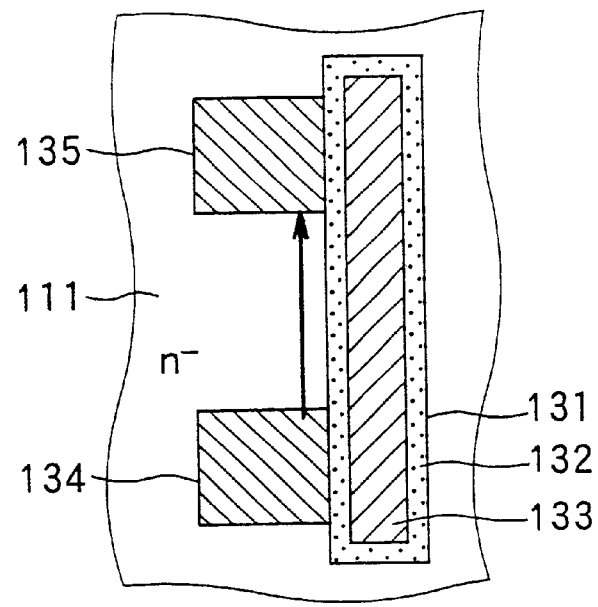
FIG. 13 is a schematic view for explaining an operation of a p-channel MOSFET shown in FIG. 12.

A p type source region 134 and a p type drain region 135 are provided in the n⁻ type well layer 111 in contact with the side face of the trench 131. Each of the p type source region 134 and the p type drain region 135 extends from the main surface 1a in the direction X with a depth and an impurity concentration which are approximately equal to those of the contact region 120. In the p-channel MOSFET having the above-mentioned structure, as shown in FIG. 13, a channel region is formed along the side face of the trench 131 so that current flows between the source region and the drain region when a driving voltage is applied to the gate electrode 133.

When the CMOS is constructed as above, the power MOSFET and the peripheral device can be formed at the same manufacturing steps even when the peripheral device is formed on the identical substrate with the power MOSFET. For example, when the trenches 5 of the power MOSFET are formed, the trenches 14, 15 of the n-channel MOSFET and the trench 131 of the p-channel MOSFET are formed simultaneously. During the thermal oxidation for forming the gate oxide film 6 of the power MOSFET, the gate oxide film 16 and the oxide film 18 of the n-channel MOSFET, and the gate oxide film 132 of the p-channel MOSFET are formed simultaneously. Successively, when the gate electrode 7 of the power MOSFET is formed, the gate electrode 17 and the poly silicon layer 19 of the n-channel MOSFET and the gate electrode 133 of the p-channel MOSFET are formed simultaneously. Thus, the power MOSFET and the CMOS can be formed at the same manufacturing steps, resulting in simplified manufacturing method of the semiconductor device.

Figure 14:
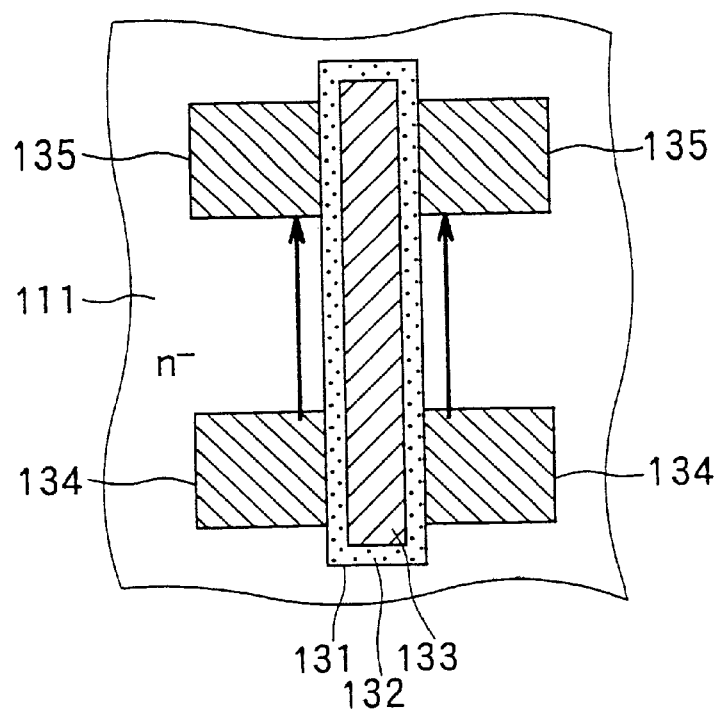
FIG. 14 is a schematic view showing a structure of a p-channel MOSFET as a modified embodiment.

In the eighth embodiment, the p type source region 134 and the p type drain region 135 are disposed at one side of the trench 131; however, as shown in FIG. 14, they may be disposed at both sides of the trench 131. In this case, because the channel region is formed along the both side faces of the trench 131, the channel width is increased twice substantially. This results in reduced channel resistance.

Figure 15:
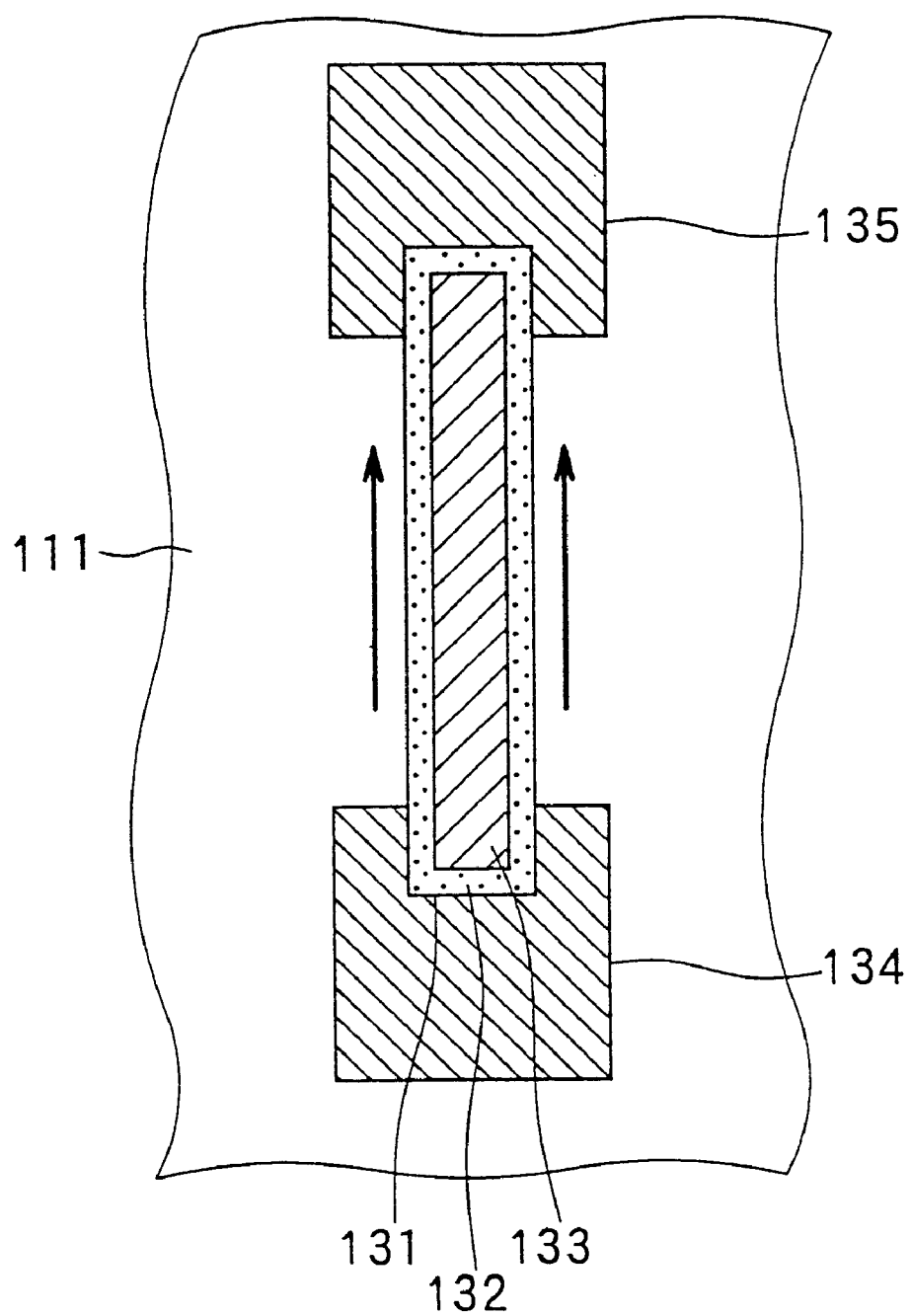
FIG. 15 is a schematic view showing a structure of a p-channel MOSFET as another modified embodiment.

Also, as shown in FIG. 15, the p type source region 134 and the p type drain region 135 may be provided to surround both end portions of the trench 131 in the longitudinal direction of the trench 131. In this case, likewise, the channel region is formed along the both side faces of the trench 131, so that the same advantages as described above can be attained. Incidentally, in the embodiments described above, although the drain region is composed of the n⁺ type substrate 1, the drain region may be composed of a region extending from the main surface 1a in the direction perpendicular to the main surface 1a. In the respective embodiments, the conductive types of the p type and the n type may be inversed to each other. In this case, in the structure of the seventh embodiment, a p-channel MOSFET is formed as a peripheral device. In the structure of the eighth embodiment, the positions of the p-channel MOSFET and the n-channel MOSFET in the CMOS are inversed to each other with respect to those shown in FIG. 12.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a semiconductor substrate of a first conductivity type having a main surface that includes a power MOSFET formation region having a first trench for forming a power MOSFET thereon and a peripheral device formation region having a second trench for forming a peripheral device thereon, the semiconductor substrate surrounding the first trench being as a drain of the power MOSFET;
   a well layer of a second conductivity type disposed in the second trench of the peripheral device formation region;
   wherein the MOSFET includes:
      a drift region of a first conductivity type disposed in the first trench and having an impurity concentration lower than that of the semiconductor substrate;
      a base region of the second conductivity type formed in the drift region and extending from the main surface in a perpendicular direction with respect to the main surface; and
      a source of the first conductivity type formed in the base region and extending from the main surface in the perpendicular direction.

2. The semiconductor device according to claim 1, wherein:
   the power MOSFET comprises;
      a drift region of the first conductivity type, disposed in the first trench and having an impurity concentration lower than that of the semiconductor substrate;

a base region of the second conductivity type, disposed in the drift region and extending from the main surface in a perpendicular direction with respect to to the main surface;

a source region of the first conductivity type, disposed in the base region and extending from the main surface in the perpendicular direction;

a gate insulating film disposed on a surface of a third trench that extends from the main surface in the perpendicular direction and penetrates the source region and the base region; and a gate electrode disposed on the gate insulating film and filling the third trench; and the peripheral device comprises;

a semiconductor layer of the first conductivity type having an impurity concentration lower than that of the semiconductor substrate, and disposed in the second trench; and the well layer disposed in the semiconductor layer.

3. The semiconductor device according to claim 2, wherein the second trench has a depth that is equal to or less than a thickness of the drift region.

4. The semiconductor device according to claim 2, wherein the second trench has a width that is twice or less than twice as large as a thickness of the drift region.

5. The semiconductor device according to claim 2, wherein the second trench has a depth that is equal to or less than a sum of a thickness of the drift region and a thickness of the base region.

6. The semiconductor device according to claim 2, wherein the second trench has a width that is equal to or less than twice as large as a sum of a thickness of the drift region and a thickness of the base region.

7. A semiconductor device comprising:

a first conductivity type semiconductor substrate;

a power MOSFET formed in the semiconductor substrate at a power MOSFET formation region, the power MOSFET including a drain that is composed of the semiconductor substrate;

a peripheral device formed in the semiconductor substrate at a peripheral device formation region; and a semiconductor region surrounding the peripheral device to separate the peripheral device from the semiconductor substrate, and having an impurity concentration lower than that of the semiconductor substrate;

wherein the MOSFET includes;

a drift region of a first conductivity type disposed in the first trench and having an impurity concentration lower than that of the semiconductor substrate;

a base region of the second conductivity type formed in the drift region and extending from the main surface in a perpendicular direction with respect to the main surface; and a source of the first conductivity type formed in the base region and extending from the main surface in the perpendicular direction.

8. The semiconductor device according to claim 7, wherein the semiconductor region is provided in a trench provided in the semiconductor substrate at the peripheral device formation region.

9. The semiconductor device according to claim 8, wherein the semiconductor region is composed of a first conductivity type semiconductor region having an impurity concentration lower than that of the semiconductor substrate and disposed on an inner wall of the trench, and a second conductivity type semiconductor well region provided in a surface portion of the first conductivity type semiconductor region.

10. The semiconductor device according to claim 7, wherein:

the power MOSFET is provided in a first trench of the semiconductor substrate;

the semiconductor region in which the peripheral device is provided is provided in a second trench of the semiconductor substrate, the second trench being different from the first trench in size.

11. The semiconductor device according to claim 10, wherein at least one of a width and a depth of the second trench is smaller than that of the first trench.

* * * * *